US005446792A

United States Patent [19]

Sango

[11] Patent Number: 5,446,792

[45] Date of Patent: Aug. 29, 1995

[54] REFLECTION-TYPE SPEAKER APPARATUS

[75] Inventor: Hitoshi Sango, Saitama, Japan

[73] Assignee: Kabushiki Kaisha Toshiba, Japan

[21] Appl. No.: 170,922

[22] Filed: Dec. 21, 1993

[30] Foreign Application Priority Data

Dec. 25, 1992 [JP] Japan .................................. 4-346907

[51] Int. Cl.[6] ........................ H04R 25/00; H04N 5/64; H05K 5/00

[52] U.S. Cl. ...................................... 381/160; 381/24; 381/90; 381/158; 181/155

[58] Field of Search ................. 381/160, 158, 159, 90, 381/24, 86; 181/155, 156, 150; H04N 5/64

[56] References Cited

U.S. PATENT DOCUMENTS 3,765,504 10/1973 Itoh .................................... 181/155
3,912,866 10/1975 Fox ..................................... 381/159

FOREIGN PATENT DOCUMENTS 0035699 2/1986 Japan .................................. 381/160
2226214 6/1990 United Kingdom ................ 381/159

OTHER PUBLICATIONS

Australia Patent 143,597, "Improvements in or relating to Londspeaker Units", Sep. 27, 1951.

*Primary Examiner*—Curtis Kuntz
*Assistant Examiner*—Sinh Tran
*Attorney, Agent, or Firm*—Banner & Allegretti, Ltd.

[57] ABSTRACT

A speaker apparatus includes a speaker having a diaphragm, a frame having a mouth and a reflector. The speaker is mounted inside a cylindrical box, and the frame is formed cylindrically and covers over the diaphragm. The mouth opens perpendicular to an axis along the center of the diaphragm. The reflector is positioned opposite the diaphragm in the frame and is formed roughly conically but asymmetrically between a side of the mouth and the opposite side of the cylindrical box. Sound waves radiated from the diaphragm are reflected by the reflector and an inner surface of the frame, and are released to the outside of the mouth.

5 Claims, 3 Drawing Sheets

FIG.1.
(PRIOR ART)
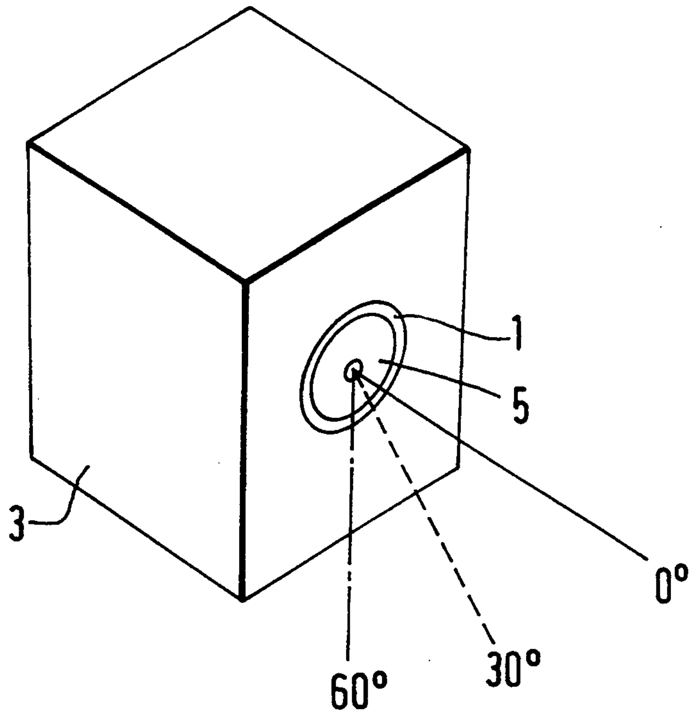
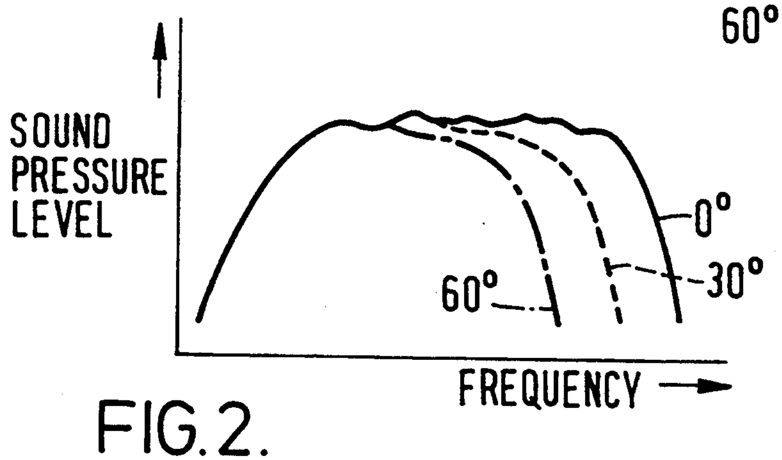
FIG.2.
(PRIOR ART)
FIG.3.
(PRIOR ART)
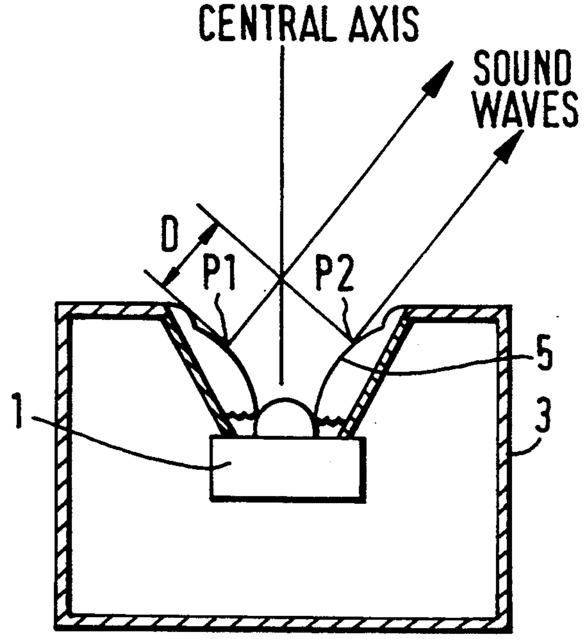

FIG. 4.
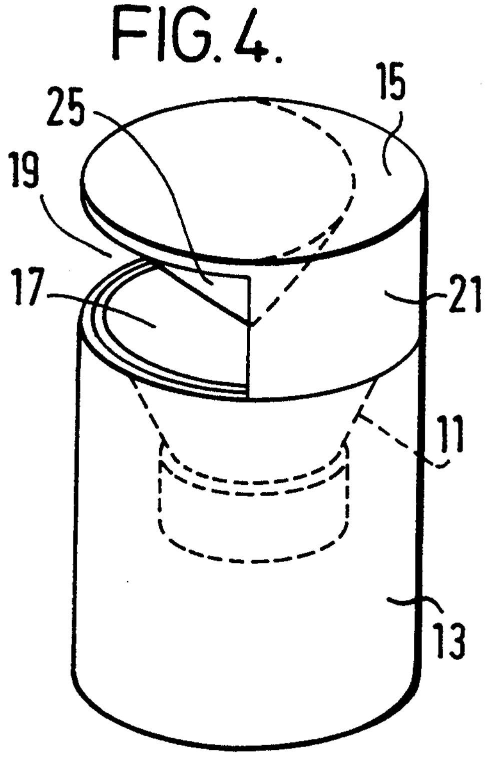
FIG. 5.
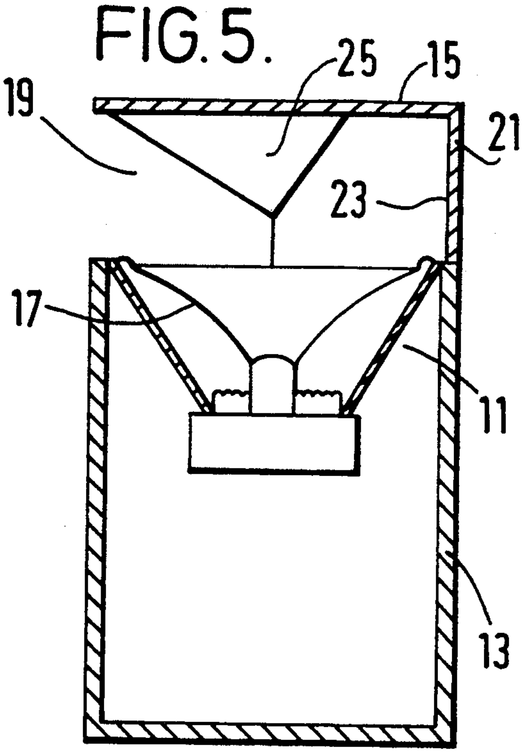
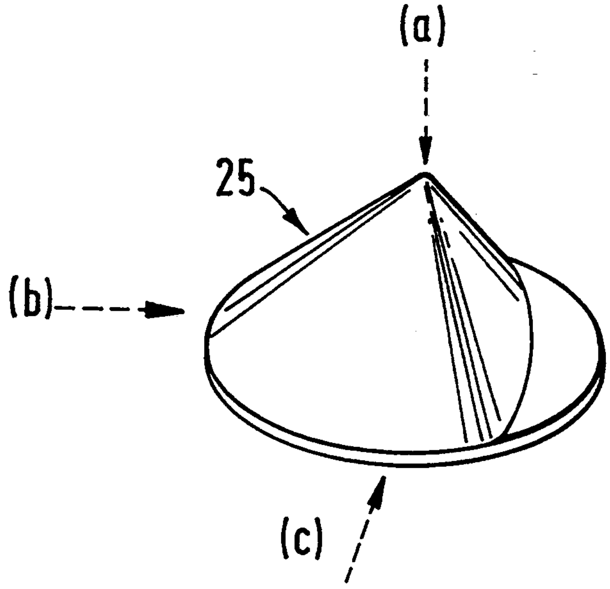
FIG. 6.
FIG. 7(a).
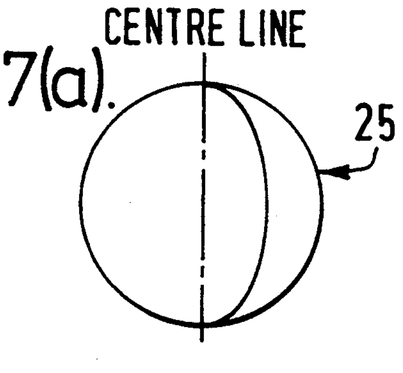
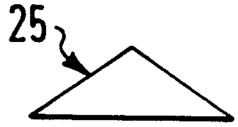
FIG. 7(b).
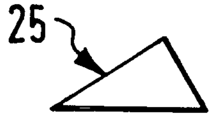
FIG. 7(c).

REFLECTION-TYPE SPEAKER APPARATUS

FIELD OF THE INVENTION

The present invention generally relates to the field of speakers, and more particularly, is directed to a reflection-type speaker apparatus which has a directional characteristic capable of directing sound waves radiated from a diaphragm in a specified direction.

BACKGROUND OF THE INVENTION

FIG. 1 is a perspective view illustrating a conventional speaker system, and FIG. 2 is a diagram showing frequency curves of sound pressure level in the conventional speaker system of FIG. 1. In FIG. 2, the vertical axis shows sound pressure level, and the horizontal axis shows frequency.

In FIG. 1, speaker 1 is secured in box 3, and sound waves are radiated from diaphragm 5 of speaker 1. Suppose that the solid line (at 0 degrees) indicates the central axis of speaker 1, and the broken line and the single-dot broken line indicate the directions at angles of 30 and 60 degrees from the central axis, respectively. These three types of lines in FIG. 2 respectively indicate the sound pressure levels at the corresponding angles. As is apparent from FIG. 2, the larger the angle from the central axis, at 30 and 60 degrees, and the higher the frequency component, the less the sound pressure level. Thus, since the sound pressure level is what makes a particular frequency audible, FIG. 2 shows that the higher frequencies become inaudible at greater angles.

FIG. 3 is a cross-sectional view showing the conventional speaker system of FIG. 1 and will now be used for explaining the reason of the above-mentioned phenomenon. The sound waves radiated from each concentric part of diaphragm 5 (for example, points P1 and P2) are at the same distance from diaphragm 5 on the central axis. However, in the diagonal direction of 30 and 60 degrees, the distances from each concentric part are different. Therefore, in the high frequency band of sound waves which has a short wavelength, since half of the wavelength becomes equal to the difference D of these distances, the sound waves become weaker due to mutual cancelling out.

For this reason, in the known speaker system, the sound pressure level is reduced in the direction having an angle from the central axis of the speaker. Moreover, the greater such angle and the higher the frequency band of sound waves, the more noticeably the sound pressure level is reduced.

SUMMARY OF THE INVENTION

In accordance with the present invention, a speaker apparatus includes a speaker having a diaphragm, a frame having a mouth and a reflector. The frame covers over the diaphragm, and the reflector is positioned in the frame opposite the diaphragm. Sound waves radiated from the diaphragm are reflected by the reflector and an inner surface of the frame, and are released outside from the mouth. In a preferred embodiment of the present invention, the reflector has a roughly conical shape but has an asymmetrical shape between the side of the mouth and the opposite side.

It is therefore an object of the present invention to provide a speaker apparatus which can improve a sound pressure level in a direction having an angle from a central axis of sound distribution.

Another object of the present invention is to provide a reflection-type speaker apparatus having a superior radiation efficiency of sound waves.

The above and other objects of the present invention will become clearer upon an understanding of the illustrative embodiment described below. Various advantages which may be not referred to herein will also occur to those skilled in the art upon employment of the present invention in practice.

BRIEF DESCRIPTION OF THE DRAWINGS

FIG. 1 is a perspective view illustrating a known speaker system.

FIG. 2 is a diagram showing frequency curves of sound pressure level in the known speaker system of FIG. 1.

FIG. 3 is a cross-sectional view showing the known speaker system of FIG. 1.

FIG. 4 is a perspective view illustrating a speaker apparatus in accordance with an embodiment of the present invention.

FIG. 5 is a vertical cross-sectional view showing the speaker apparatus of FIG. 4.

FIG. 6 is a perspective view showing the shape of reflector 25 in FIG. 4.

FIG. 7(*a*), (*b*) and (*c*) are respectively a top, a front elevation and a side elevation views showing reflector 25 of FIG. 6.

DETAILED DESCRIPTION OF THE PREFERRED EMBODIMENTS

Figure 8:
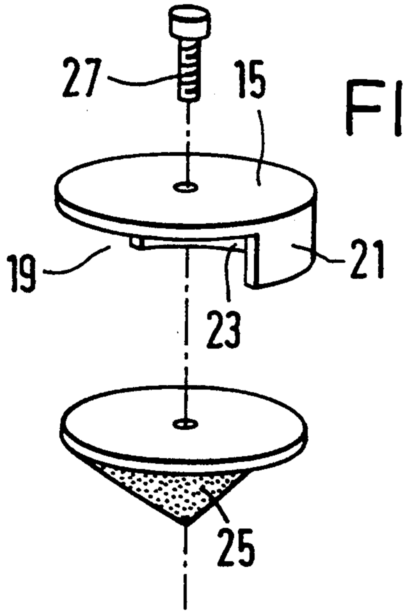
FIG. 8 is an exploded perspective view showing frame 15 and reflector 25 in FIG.

Representative embodiment of the present invention will now be explained with reference to the accompanying drawings.

FIG. 4 is a perspective view illustrating a speaker apparatus in accordance with an embodiment of the present invention, and FIG. 5 is a vertical cross-sectional view showing the speaker apparatus of FIG. 4.

As shown in FIGS. 4 and 5, speaker 11 is mounted inside cylindrical box 13 which has one end open for installing speaker 11. Frame 15 having a cylindrical shape is provided over diaphragm 17 of speaker 11, and includes mouth 19 for radiating sound waves in the horizontal direction and shield 21. Mouth 19 opens perpendicularly to the central axis of diaphragm 17. The inner surface 23 of shield 21 opposite mouth 19 reflects sound waves. In addition, frame 15 encloses reflector 25 which is positioned opposite diaphragm 17 and has a roughly conical shape. Accurately speaking, the shape of reflector 25 is conical in the half portion thereof at the side of mouth 19 with the centerline as a boundary, but the shape of the other half at the side of shield 21 has a slope with a steep inclination.

FIG. 6 is a perspective view showing the shape of reflector 25. FIG. 7(*a*), (*b*) and (*c*) are respectively a top, a front elevation and a side elevation views showing reflector 25 of FIG. 6. As is apparent from these figures, reflector 25 has an asymmetrical shape with the centerline as a boundary. In at least some embodiments of the present invention, it is contemplated that with regard to FIG. 7(*c*), the angles of the reflector 25 are 30, 60 and 90 degrees, where the 90 degree angle is at the top of the Figure, and the 30 degree angle is the smaller of the other two (i.e., the angle at the left-most portion of the Figure).

FIG. 8 is an exploded perspective view showing an embodiment of frame 15 and reflector 25. Frame 15 and reflector 25 are formed as separate pieces and combined by screw 27 through their central axes. Note that frame 15 and reflector 25 may be composed of a single molding.

In the speaker apparatus of this embodiment, sound waves radiated from diaphragm 17 are reflected and diffused by reflector 25 and inner surface 23 of shield 21 inside of frame 15, and then are radiated outside. Therefore, variation of the sound pressure level due to difference of directions is reduced.

Figure 9:
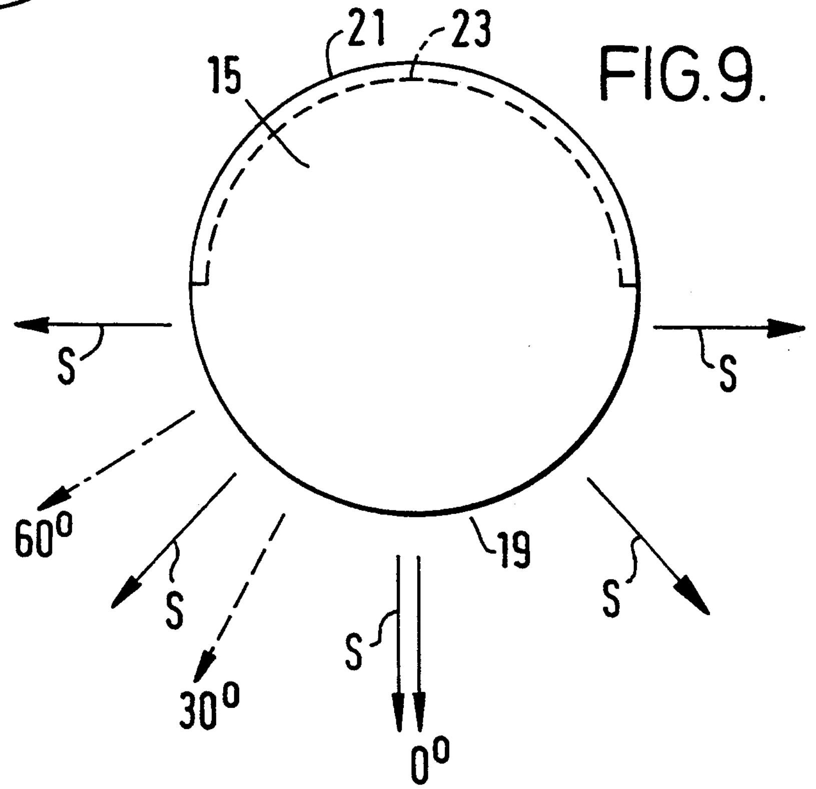
FIG. 9 is a top view showing the radiation state of the sound waves radiated from the speaker apparatus of FIG. 4.
Figure 10:
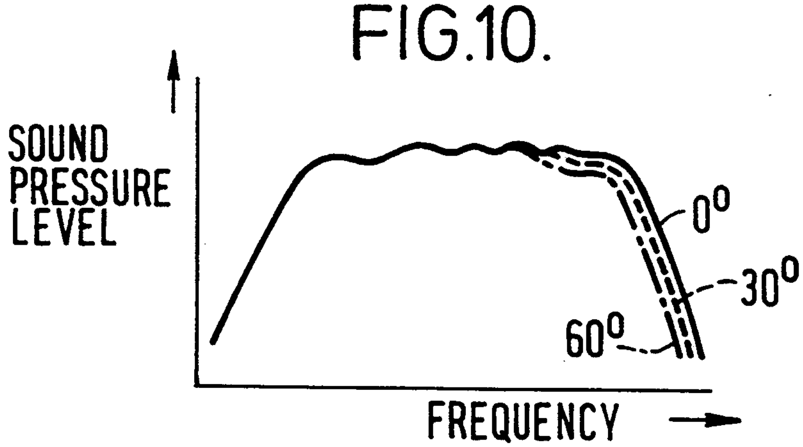
FIG. 10 is a diagram showing frequency curves of sound pressure level in the speaker apparatus of FIG. 4.

FIG. 9 is a top view showing the radiation state of the sound waves radiated from the speaker apparatus of FIG. 4. FIG. 10 is a diagram showing frequency curves of sound pressure level in the speaker apparatus. In FIG. 10, the vertical axis shows sound pressure level, and the horizontal axis shows frequency. In addition, the solid line indicates the sound pressure level on the central axis (0 degree) of the sound distribution in FIG. 9, and the broken line and the single-dot broken line respectively indicate the sound pressure levels in the directions at angles of 30 and 60 degrees from the central axis.

As shown in FIG. 9, sound waves S are distributed from mouth 19 equally to each direction through an angle of 180 degrees. Thus, as shown in FIG. 10, the energy distributions of the sound waves as the sound pressure levels in the directions of 0, 30 and 60 degrees are approximately equal, even in the high frequency band. Therefore, as is apparent by comparing with the characteristic of the conventional system in FIG. 2, the sound pressure level is noticeably improved.

Moreover, since reflector 25 has an asymmetrical shape with the centerline as a boundary at the sides of mouth 19 and shield 21, interference of sound waves inside of frame 15 is prevented. In addition to this effect, since sound waves are radiated from mouth 19 outside of frame 15 in order to prevent dispersion of the sound waves, the radiation energy can be efficiently released.

As described above, the present invention provides a speaker apparatus which can improve a sound pressure level in a direction having an angle from a central axis of sound distribution. Moreover, the present invention provides a reflection-type speaker apparatus having a superior radiation efficiency of sound waves.

While the present invention has been illustrated and described in detail in the drawing and foregoing description, it should be recognized that other embodiments will be apparent to those skilled in the art. It is therefore intended that the following claims cover any such embodiments as fall within the true spirit and scope of the invention.

What is claimed is:

1. A speaker apparatus, comprising:
- a speaker having a diaphragm for radiating sound waves;
- a frame covering over said diaphragm, and having a mouth for releasing said sound waves outside and a shield positioned opposite said mouth.
  - wherein said mouth opens perpendicularly to an axis of said diaphragm; and
- a reflector positioned in said frame opposite said diaphragm, for reflecting said sound waves radiated from said diaphragm,
  - wherein said reflector is conical, and has an asymmetrical shape between said mouth and said shield, and
  - wherein the center of said conical, asymmetrical shape is positioned on said axis of said diaphragm.

2. The speaker apparatus as claimed in claim 1, wherein said speaker is provided so that said axis of said diaphragm points in a vertical direction, and said mouth opens wide in a horizontal direction.

3. The speaker apparatus as claimed in claim 1, wherein said frame has a cylindrical inner surface.

4. The speaker apparatus as claimed in claim 3, wherein said frame covers over the entirety of said diaphragm, and wherein a first angle made by said reflector and said frame in the vicinity of said mouth is smaller than a second angle made by said reflector and said frame in the vicinity of said shield.

5. The speaker apparatus of claim 4, wherein said first angle is 30 degrees and wherein said second angle is 60 degrees.

* * * * *